United States Patent
Moler et al.

(10) Patent No.: US 7,368,856 B2
(45) Date of Patent: May 6, 2008

(54) APPARATUS AND PROCESS FOR OPTIMIZING WORK FROM A SMART MATERIAL ACTUATOR PRODUCT

(75) Inventors: Jeff Moler, Sarasota, FL (US); John Bugel, Largo, FL (US); Keith A. Thornhill, Sarasota, FL (US); Mark P. Oudshoorn, Parrish, FL (US)

(73) Assignee: Parker-Hannifin Corporation, Cleveland, OH (US)

( * ) Notice: Subject to any disclaimer, the term of this patent is extended or adjusted under 35 U.S.C. 154(b) by 338 days.

(21) Appl. No.: 10/818,004

(22) Filed: Apr. 5, 2004

(65) Prior Publication Data

US 2004/0263025 A1    Dec. 30, 2004

Related U.S. Application Data

(60) Provisional application No. 60/460,548, filed on Apr. 4, 2003.

(51) Int. Cl.
*H01L 41/08* (2006.01)
(52) U.S. Cl. .................................. 310/328
(58) Field of Classification Search ............. 310/328, 310/11
See application file for complete search history.

(56) References Cited

U.S. PATENT DOCUMENTS 3,144,802 A    8/1964    Faber, Jr.

(Continued)

FOREIGN PATENT DOCUMENTS

DE            4220177        7/1994

(Continued)

OTHER PUBLICATIONS

Dielectric and Piezoelectric response of lead Zirconate lead Titanate at high electric and mechanical loads in terms of non -180 domain wall motion).American Institute of Physic Nov. 15, 2001.*
Examination Report dated Feb. 6, 2006 from the corresponding British application.
Journal of Applied Physics, vol. 90, No. 10, "Dielectric and piezoelectric response of lead zirconate-lead titanate at high electric and mechanical loads in terms of non-180 ° domain wall motion" Chaplya, P. M. et al., pp. 5278-5286, no date/year provided.
US 5,877,442, 03/1999, Freeland et al. (withdrawn)

*Primary Examiner*—Darren Schuberg
*Assistant Examiner*—Karen Beth Addison
(74) *Attorney, Agent, or Firm*—Young Basile

(57) ABSTRACT

An apparatus and process for pre-loading an electrically stimulated smart material actuator product to obtain maximum work from the actuator. When a smart material actuator is optimally pre-loaded certain desirable characteristics become apparent, such as work, operational frequency, hysteresis, repeatability, and overall accuracy. When used in conjunction with a mechanically leveraged actuator structure the smart material actuator can be used to its greatest potential. Since the mechanically leveraged actuator can be based on the maximum work provided by the smart material actuator, certain attributes such as the force, and displacement of total system can be adjusted without loss to system efficiency. Pre-loading methods and a determination of the optimal pre-load force are disclosed. Each smart material actuator type has a unique work curve. In the design of an actuator assembly, the process of optimizing uses the unique work curve to optimize the design for the requirements of the particular application. The unique work curve is used by finding the place where the smart material actuator is capable of providing the most work in order to set the optimum pre-load point accordingly. Different mechanical pre-load techniques are provided.

30 Claims, 7 Drawing Sheets

U.S. PATENT DOCUMENTS

| | | |
|---|---|---|
| 3,405,289 A | 10/1968 | Gikow |
| 3,414,779 A | 12/1968 | Bohm |
| 3,421,109 A | 1/1969 | Wiggins et al. |
| 3,446,902 A | 5/1969 | Zuerkr |
| 3,513,309 A | 5/1970 | Hehemann |
| 3,548,314 A | 12/1970 | Mitchell |
| 3,558,936 A | 1/1971 | Horan |
| 3,614,486 A | 10/1971 | Smiley |
| 3,649,857 A | 3/1972 | Knappe |
| 3,666,975 A | 5/1972 | Balamuth |
| 3,731,214 A | 5/1973 | Bers |
| 3,749,946 A | 7/1973 | Von Ruti |
| 3,902,084 A | 8/1975 | May, Jr. |
| 3,902,085 A | 8/1975 | Bizzigotti |
| 3,903,435 A * | 9/1975 | Bouygues et al. .......... 310/328 |
| 4,009,447 A | 2/1977 | Wolf et al. |
| 4,018,124 A | 4/1977 | Rosado |
| 4,044,239 A | 8/1977 | Shimauci et al. |
| 4,080,873 A | 3/1978 | Bauer et al. |
| 4,088,052 A | 5/1978 | Weineck et al. |
| 4,088,916 A | 5/1978 | Weineck et al. |
| 4,106,390 A | 8/1978 | Kodaira et al. |
| 4,112,879 A | 9/1978 | Assenheimer et al. |
| 4,121,504 A | 10/1978 | Nowak |
| 4,157,802 A | 6/1979 | May, Jr. |
| 4,193,703 A | 3/1980 | Kakmann |
| 4,196,652 A | 4/1980 | Raskin |
| 4,207,791 A | 6/1980 | Murakami |
| 4,208,636 A | 6/1980 | German |
| 4,214,215 A | 7/1980 | Mellen et al. |
| 4,228,680 A | 10/1980 | Engel et al. |
| 4,287,582 A | 9/1981 | Tocquet |
| 4,313,361 A | 2/1982 | Murakami |
| 4,318,023 A | 3/1982 | O'Neil et al. |
| 4,319,843 A | 3/1982 | Gornall |
| 4,327,623 A | 5/1982 | Mochida et al. |
| 4,336,809 A | 6/1982 | Clark |
| 4,379,335 A | 4/1983 | Kirsch et al. |
| 4,388,908 A | 6/1983 | Babitzka et al. |
| 4,426,907 A | 1/1984 | Raskin |
| 4,426,981 A | 1/1984 | Greiner et al. |
| 4,430,899 A | 2/1984 | Wessel |
| 4,431,873 A | 2/1984 | Dunn et al. |
| 4,432,228 A | 2/1984 | Kuschmierz et al. |
| 4,434,753 A | 3/1984 | Mukainakano et al. |
| 4,435,666 A | 3/1984 | Fukui et al. |
| 4,450,753 A | 5/1984 | Basrai et al. |
| 4,460,840 A | 7/1984 | Weiger et al. |
| 4,463,727 A | 8/1984 | Babitzka et al. |
| 4,468,583 A | 8/1984 | Mori |
| 4,479,475 A | 10/1984 | Babitzka |
| 4,481,451 A | 11/1984 | Kautz et al. |
| 4,481,768 A | 11/1984 | Goshorn et al. |
| 4,570,095 A | 2/1986 | Uchikawa |
| 4,570,096 A | 2/1986 | Hara et al. |
| 4,580,540 A | 4/1986 | Babitzka et al. |
| 4,584,923 A | 4/1986 | Minnick |
| 4,612,440 A | 9/1986 | Brunnee et al. |
| 4,617,952 A | 10/1986 | Fujiwara et al. |
| 4,628,499 A | 12/1986 | Hammett |
| 4,629,039 A | 12/1986 | Imoto et al. |
| 4,629,926 A | 12/1986 | Siegal |
| 4,633,118 A | 12/1986 | Kosugi |
| 4,647,808 A | 3/1987 | Shibuya |
| 4,660,523 A | 4/1987 | Brauer et al. |
| 4,667,639 A | 5/1987 | Linder et al. |
| 4,675,568 A | 6/1987 | Uchikawa et al. |
| 4,686,338 A | 8/1987 | Kashiwagi et al. |
| 4,697,118 A | 9/1987 | Harnden, Jr. et al. |
| 4,703,215 A | 10/1987 | Asano |
| 4,714,855 A | 12/1987 | Fujimoto |
| 4,725,002 A | 2/1988 | Trachte |
| 4,732,071 A | 3/1988 | Deutsch |
| 4,735,185 A | 4/1988 | Imoto et al. |
| 4,736,131 A | 4/1988 | Fujimoto |
| 4,741,247 A | 5/1988 | Glomeau et al. |
| 4,749,897 A | 6/1988 | Natsume et al. |
| 4,750,706 A | 6/1988 | Schlagmuler |
| 4,757,223 A | 7/1988 | Ueyama |
| 4,763,560 A | 8/1988 | Sasaki |
| 4,769,569 A | 9/1988 | Stahlhuth |
| 4,777,398 A | 10/1988 | Shibuya |
| 4,783,610 A | 11/1988 | Asano |
| 4,790,233 A | 12/1988 | Backe et al. |
| 4,793,313 A | 12/1988 | Paganon et al. |
| 4,803,908 A | 2/1989 | Skinn et al. |
| 4,808,874 A | 2/1989 | Stahlhuth |
| 4,816,713 A | 3/1989 | Change, Jr. |
| 4,819,543 A | 4/1989 | Leinen |
| 4,821,726 A | 4/1989 | Tamura et al. |
| 4,835,747 A | 5/1989 | Billet |
| 4,838,233 A | 6/1989 | Hayashi et al. |
| 4,847,193 A | 7/1989 | Richards et al. |
| 4,857,791 A | 8/1989 | Uchino et al. |
| 4,874,978 A | 10/1989 | Sakaida et al. |
| 4,874,979 A | 10/1989 | Rapp |
| 4,874,980 A | 10/1989 | Mine et al. |
| 4,878,417 A | 11/1989 | Facon |
| 4,893,750 A | 1/1990 | Haworth et al. |
| 4,901,625 A | 2/1990 | Bussan et al. |
| 4,907,748 A | 3/1990 | Gardner et al. |
| 4,909,126 A | 3/1990 | Skinn et al. |
| 4,929,859 A | 5/1990 | Suzuki et al. |
| 4,932,311 A | 6/1990 | Mibu et al. |
| 4,933,591 A | 6/1990 | Stahlhuth |
| 4,937,489 A | 6/1990 | Hattori et al. |
| 4,940,037 A | 7/1990 | Eckert |
| 4,947,077 A | 8/1990 | Murata |
| 4,979,275 A | 12/1990 | Sakaida et al. |
| 4,999,284 A | 3/1991 | Ward et al. |
| 5,004,946 A | 4/1991 | Sakaida et al. |
| 5,009,142 A | 4/1991 | Kurtz |
| 5,027,027 A | 6/1991 | Orbach et al. |
| 5,028,834 A | 7/1991 | Sakaida et al. |
| 5,034,647 A | 7/1991 | Ohtsuka |
| 5,038,657 A | 8/1991 | Busley |
| 5,040,514 A | 8/1991 | Kubach |
| 5,063,542 A | 11/1991 | Petermann et al. |
| 5,065,660 A | 11/1991 | de Buda |
| 5,072,288 A | 12/1991 | MacDonald et al. |
| 5,078,241 A | 1/1992 | Ackermann et al. |
| 5,080,079 A | 1/1992 | Yoshida et al. |
| 5,094,429 A | 3/1992 | Dostert |
| 5,109,885 A | 5/1992 | Tauscher |
| 5,115,880 A | 5/1992 | Sallas et al. |
| 5,154,207 A | 10/1992 | Bolt |
| 5,157,256 A | 10/1992 | Aaron |
| 5,161,774 A | 11/1992 | Engelsdorf et al. |
| 5,182,484 A | 1/1993 | Culp |
| 5,191,252 A | 3/1993 | Sano |
| 5,199,641 A | 4/1993 | Hohm et al. |
| 5,205,147 A | 4/1993 | Wada et al. |
| 5,211,196 A | 5/1993 | Schwelm |
| 5,237,238 A | 8/1993 | Berghaus et al. |
| 5,239,904 A | 8/1993 | Yamaguchi et al. |
| 5,270,984 A | 12/1993 | Mine |
| 5,314,175 A | 5/1994 | Izumi et al. |
| 5,319,257 A | 6/1994 | McIntyre |
| 5,323,680 A | 6/1994 | Miller et al. |
| 5,323,948 A | 6/1994 | Yamazaki et al. |
| 5,328,149 A | 7/1994 | Reuter |
| 5,332,942 A | 7/1994 | Rennex |
| 5,333,455 A | 8/1994 | Yoshioka |
| 5,335,862 A | 8/1994 | Esper |

| | | |
|---|---|---|
| 5,343,793 A | 9/1994 | Pattie |
| RE34,823 E | 1/1995 | Sakaida et al. |
| 5,388,751 A | 2/1995 | Harada et al. |
| 5,390,579 A | 2/1995 | Burgon |
| 5,410,206 A | 4/1995 | Lueke et al. |
| 5,410,207 A | 4/1995 | Miura et al. |
| 5,413,076 A | 5/1995 | Koenigswieser et al. |
| 5,424,941 A | 6/1995 | Bolt et al. |
| 5,425,343 A | 6/1995 | Akaki et al. |
| 5,425,941 A | 6/1995 | Wilson et al. |
| 5,435,477 A | 7/1995 | Torihata et al. |
| 5,444,324 A | 8/1995 | Priest et al. |
| 5,460,202 A | 10/1995 | Hanley et al. |
| 5,465,021 A | 11/1995 | Visscher et al. |
| 5,477,831 A | 12/1995 | Akaki et al. |
| 5,479,064 A | 12/1995 | Sano |
| 5,482,213 A | 1/1996 | Matsusaka et al. |
| 5,500,777 A | 3/1996 | Hasegawa et al. |
| 5,501,986 A | 3/1996 | Ward et al. |
| 5,518,184 A | 5/1996 | Potz et al. |
| 5,587,536 A | 12/1996 | Rasmussen |
| 5,645,226 A | 7/1997 | Bright |
| 5,685,485 A | 11/1997 | Mock et al. |
| 5,697,554 A | 12/1997 | Auwaerter et al. |
| 5,712,524 A | 1/1998 | Suga |
| 5,746,422 A | 5/1998 | Harada et al. |
| 5,751,090 A | 5/1998 | Henderson |
| 5,779,149 A | 7/1998 | Hayes, Jr. |
| 5,780,759 A | 7/1998 | Szalay |
| 5,780,956 A | 7/1998 | Oliver et al. |
| 5,780,957 A | 7/1998 | Oliver et al. |
| 5,803,370 A | 9/1998 | Heinz et al. |
| 5,810,225 A | 9/1998 | Itoh et al. |
| 5,824,929 A | 10/1998 | Freeland et al. |
| 5,824,937 A | 10/1998 | Szalay |
| 5,831,264 A | 11/1998 | Shedd et al. |
| 5,847,387 A | 12/1998 | Shedd et al. |
| 5,859,378 A | 1/1999 | Freeland et al. |
| 5,859,561 A | 1/1999 | Vanoli |
| 5,875,764 A | 3/1999 | Kappel et al. |
| 5,881,767 A | 3/1999 | Loser |
| 5,883,323 A | 3/1999 | Kaufman |
| 5,886,270 A | 3/1999 | Wynn |
| 5,901,896 A | 5/1999 | Gal |
| 5,907,211 A | 5/1999 | Hall et al. |
| 5,907,212 A | 5/1999 | Okada |
| 5,907,269 A * | 5/1999 | Zrostlik .................. 335/215 |
| 5,934,976 A | 8/1999 | Makino et al. |
| 5,946,969 A | 9/1999 | Munekata et al. |
| 5,950,668 A | 9/1999 | Baumann |
| 5,975,428 A | 11/1999 | Potschin et al. |
| 5,977,467 A | 11/1999 | Freeland et al. |
| 6,003,428 A | 12/1999 | Mundie et al. |
| 6,003,836 A | 12/1999 | Cewers |
| 6,016,040 A | 1/2000 | Hoffmann et al. |
| 6,021,760 A | 2/2000 | Boecking |
| 6,025,671 A | 2/2000 | Boecking |
| 6,035,722 A | 3/2000 | Giersch et al. |
| 6,040,643 A | 3/2000 | Bruns |
| 6,060,814 A | 5/2000 | Hoffmann et al. |
| 6,062,533 A | 5/2000 | Kappel et al. |
| 6,085,632 A | 7/2000 | Stoll et al. |
| 6,104,125 A | 8/2000 | Pan et al. |
| 6,131,879 A | 10/2000 | Kluge et al. |
| 6,166,307 A | 12/2000 | Caulkins et al. |
| 6,230,606 B1 | 5/2001 | Sato |
| 6,246,157 B1 | 6/2001 | Oliver et al. |
| 6,246,287 B1 | 6/2001 | Yamashita |
| 6,291,928 B1 | 9/2001 | Lazarus et al. |
| 6,294,859 B1 | 9/2001 | Jaenker |
| 6,305,264 B1 | 10/2001 | Yang et al. |
| 6,411,009 B2 | 6/2002 | Jaenker |
| 6,431,340 B1 | 8/2002 | Ineson et al. |
| 6,453,261 B2 | 9/2002 | Boger et al. |
| 6,548,938 B2 | 4/2003 | Moler et al. |
| 6,567,255 B1 | 5/2003 | Panzer et al. |
| 6,642,067 B2 | 11/2003 | Dwyer |
| 6,759,790 B1 * | 7/2004 | Bugel et al. ................. 310/328 |
| 6,870,305 B2 | 3/2005 | Moler |
| 6,924,586 B2 * | 8/2005 | Moler ......................... 310/328 |
| 2001/0030306 A1 | 10/2001 | Moler et al. |
| 2002/0163282 A1 | 11/2002 | Heinz ......................... 310/328 |
| 2004/0035106 A1 | 2/2004 | Moler et al. |
| 2004/0045148 A1 | 3/2004 | Moler |
| 2004/0125472 A1 | 7/2004 | Belt |

FOREIGN PATENT DOCUMENTS

| | | |
|---|---|---|
| DE | 19523229 A1 | 1/1997 |
| DE | 19946003 | 5/2000 |
| DE | 19946838 | 10/2000 |
| EP | 61296781 | 12/1986 |
| EP | 01185175 | 7/1989 |
| EP | 0 325 764 | 8/1989 |
| EP | 0 704 916 A1 | 9/1995 |
| JP | 60-180026 | 9/1985 |
| JP | 60-180036 | 9/1985 |
| JP | 61-150287 | 7/1986 |
| JP | 62-23381 | 1/1987 |
| JP | 6-221788 | 9/1987 |
| JP | 62-21788 | 9/1987 |
| JP | 1-152976 | 6/1989 |
| JP | 1-217982 | 8/1989 |
| JP | 2-218579 | 8/1990 |
| JP | 2-260476 | 10/1990 |
| JP | 3234981 | 10/1991 |
| JP | 4-165966 | 11/1992 |
| JP | 5-305574 | 11/1993 |
| JP | 6-105568 | 4/1994 |
| JP | 6105568 | 4/1994 |
| JP | 7-236287 | 5/1995 |
| JP | 8093944 | 4/1996 |
| JP | 10-248278 | 9/1998 |
| WO | WO 98/23868 | 6/1998 |
| WO | WO0179731 A | 10/2000 |
| WO | WO 01/78160 | 10/2001 |

\* cited by examiner

APPARATUS AND PROCESS FOR OPTIMIZING WORK FROM A SMART MATERIAL ACTUATOR PRODUCT

CROSS-REFERENCE TO RELATED APPLICATIONS

This application claims the benefit of provisional patent application Ser. No. 60/460,548 filed on Apr. 4, 2003, which is incorporated by reference herein in its entirety.

FIELD OF THE INVENTION

The present invention relates generally to an actuator assembly, and more specifically relates to optimization of work from a support structure moveable in response to electrical activation of a smart material actuator.

BACKGROUND OF THE INVENTION

The invention is based on actuator technologies being developed for a wide range of applications including industry. One component used in this type of actuator is an electrically stimulated smart material actuator. These smart material actuators when electrically stimulated change shape. This shape change can be designed such that one axis predominantly changes. As this axis changes dimension it is magnified by a lever integral to the main support structure creating an actuator with a useful amount of displacement. This displacement is useful for general-purpose industrial applications such as grippers, linear motors, and consumer applications such as speakers. Presently, electromechanical devices are used such as motors, solenoids, and voice coils. In general these devices encompass many shortcomings, i.e. they are large and heavy, consume high amounts of power, and do not work in a proportional manner.

Various types of smart material actuators are known to those skilled in the art. Traditionally the smart material actuator is used two ways, first direct acting and second in a mechanically leveraged system. Most of these systems have some sort of mechanical pre-load. This pre-load has largely been used to capture the smart material actuator within the main structure. It has not generally been recognized that the pre-load force applied to the smart material actuator can affect the performance of the actuator.

In such known devices, when the smart material actuator is electrically activated, the geometry of the device expands predominantly along a predetermined axis. When the smart material device is deactivated, the geometry of the device contracts predominantly along the predetermined axis. This expansion and contraction of the smart material can be used to operate an apparatus, e.g. to open or close a gripper or vibrate a speaker cone.

SUMMARY OF THE INVENTION

Heretofore, it has not generally been recognized that individual smart material actuator types have an optimal pre-load and/or range, where the smart material actuator provides optimal work. For the purpose of this discussion, work is defined as the force/displacement product, given that input energy is relatively constant. When using the smart material actuator within its peak work area, the smart material actuator is at its peak efficiency. Since the optimal pre-load for a large smart actuator can be greater than 100 pounds, the method used to create the pre-load force is critical.

The smart material can be disposed between a main support structure with an integral hinge, spring, and at least one arm in a curvilinear path around the main support structure. The optimal pre-load force can be designed into the main support structure and provide for pre-load adjustment. The smart material actuator in most known configurations provides little opportunity to select different hinge axis locations, high pre-load forces and/or structural configurations to optimize performance. These objectives have been a difficult combination to achieve with inexpensive materials for high volume commercialization of smart material actuators.

The present invention optimizes the performance of a smart material actuator, providing performance and flexibility never possible before. The present invention provides a process for determining optimal preload for a mechanically leveraged smart material actuator. Preferably, a smart material actuator can be captured in place between a rigid non-flexing portion and force transfer member, by way of example and not limitation, machined from a single block of material with integral preload mechanism. The apparatus can include a support having a rigid non-flexing portion, at least one arm portion extending forward from the rigid portion, at least one surface on each pivotable arm for movement relative to the support structure, and a force transfer member operably positioned with respect to the at least one arm. A rigid non-flexing portion can support the preload mechanism. An actuator can be operably engaged between the preload mechanism and the force transfer member to drive the force transfer member in movement along a fixed path causing the at least one pivotable arm portion to pivot in response to an electrical activation. The support, pivotable arm, and force transfer member of the structure can be designed to be rigid, non-flexing portions of a monolithic structure interconnected by flexible hinge portions allowing the at least one arm to move relative to the remaining support structure. Any unplanned flexing can reduce the effective life of the mechanism, and reduce the amount of force transferred through the hinge axis to the at least one pivot arm. The reduction in force limits the displacement and force of the pivoting arm. The selection of the hinge axis location and corresponding structural configuration can allow substantial capability to optimize the performance and size of the apparatus for the particular application.

The smart material can be preloaded with a force when installed in the support element. For example, the smart material actuator can be clamped within the support structure with an adjustable screw supporting one end allowing the optimal force preloading. An adjustable screw configuration is easy to use and allows for a large adjustability. Depending on the preload force an acceptable screw configuration can be designed. Preloading the smart material actuator in a suitable fashion can contribute to the maximum efficiency of the force transfer during the actuation, and allows fine-tuning of the initial position of the apparatus prior to the actuation of the smart material element. Certain smart materials have an optimal preload, i.e. the actuator performs the largest amount of work at that preload. Preload can also ensure that the smart material actuator maintains contact with the apparatus at opposite ends throughout the range of expansion and contraction. The use of a threaded adjustment screw for preloading enables assembly without requiring adhesives or other means of securely connecting the smart material actuator at opposite ends to the apparatus, and avoids the possibility of damaging tension or torsional movements on the smart material actuator. The threaded adjustment screw allows simple compensation for dimensional variations in the smart material actuator during assembly to the support. The present invention optimizes the preload such that the smart material actuator can provide the optimal work, as well as several preload mechanisms suitable for the apparatus.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DESCRIPTION OF THE PREFERRED EMBODIMENT

Figure 1:
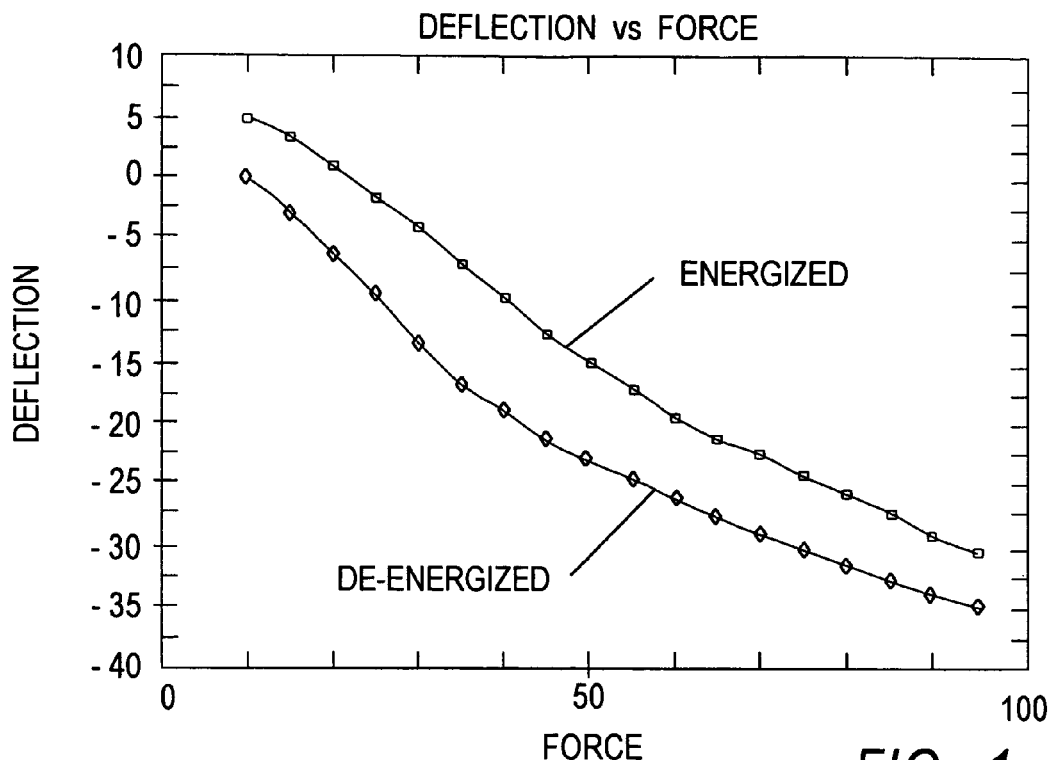
FIG. 1 is a graph illustrating the performance of a smart material actuator showing deflection versus force for both energized and de-energized states.

Referring now to FIG. 1, a displacement-force graph for a smart material actuator both energized and de-energized is depicted. For the de-energized curve the smart material actuator was shorted or de-energized. The de-energized curve was taken starting at a force of 10 and an ending force of 100. The compressive deflection was noted at various points between the forces of 10 to 100. These points were then plotted as the line on the graph in FIG. 1 with diamonds to indicate the series. For the energized curve the smart material actuator was connected to a power supply delivering the correct actuation voltage. The energized curve was taken starting at a force of 10 and an ending force of 100. These points were then plotted as the line on the graph in FIG. 1 with squares to indicate the series. From the graph it can be seen that the energized and de-energized functions are not linear, nor are the lines parallel to each other. This means that the delta displacement between energized and de-energized states at a given force can be greater than or less than the delta displacement at another point.

Figure 2:
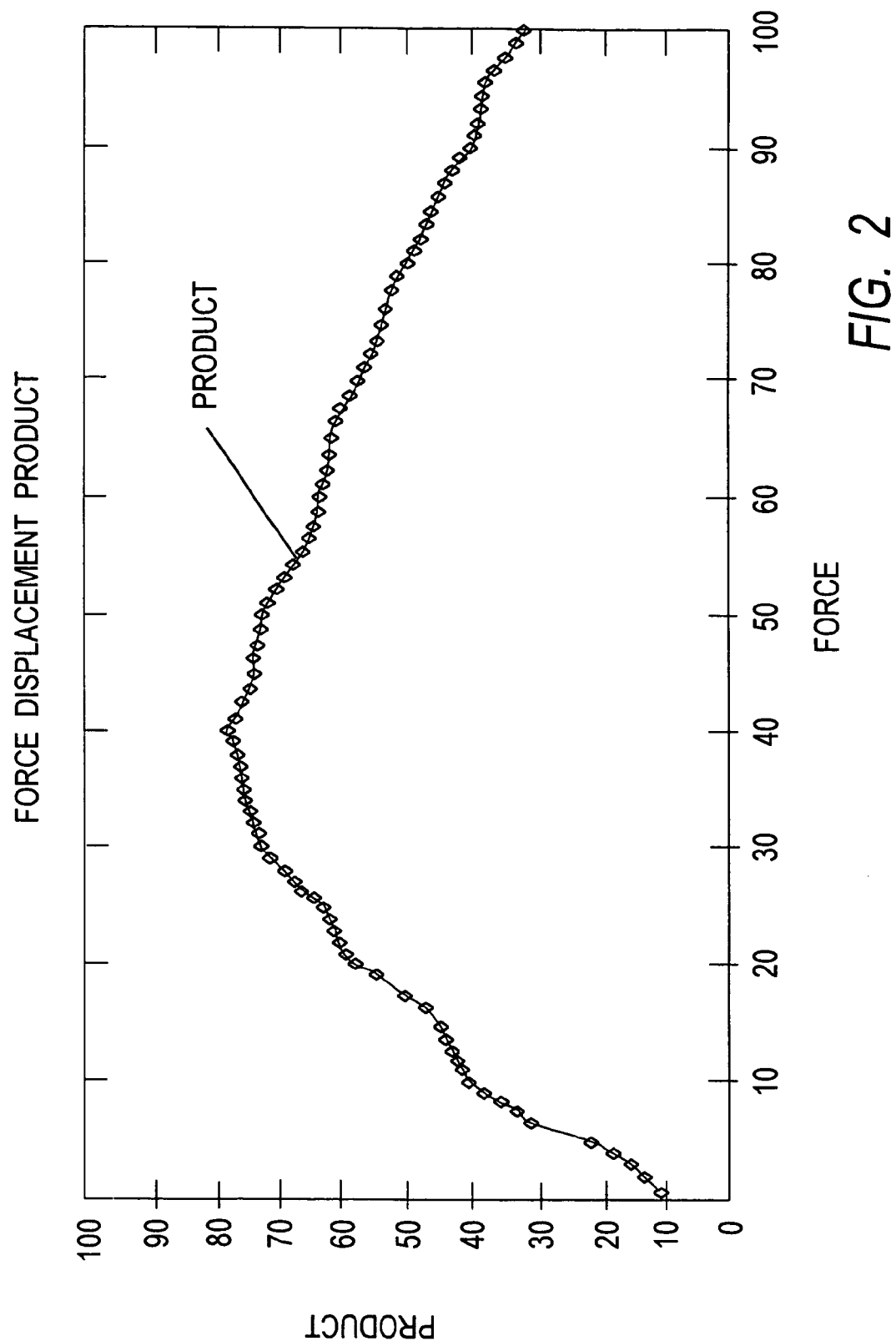
FIG. 2 is a graph illustrating the product of displacement times blocking force versus force for the values shown in FIG. 1.

Now referring to FIG. 2, a delta displacement-force product graph derived from the graph in FIG. 1 is depicted. This graph indicates a peak work value at 40. That is the product of the force times the delta displacement is its greatest value at 40 indicating the displacement and force are peaking.

Figure 3:
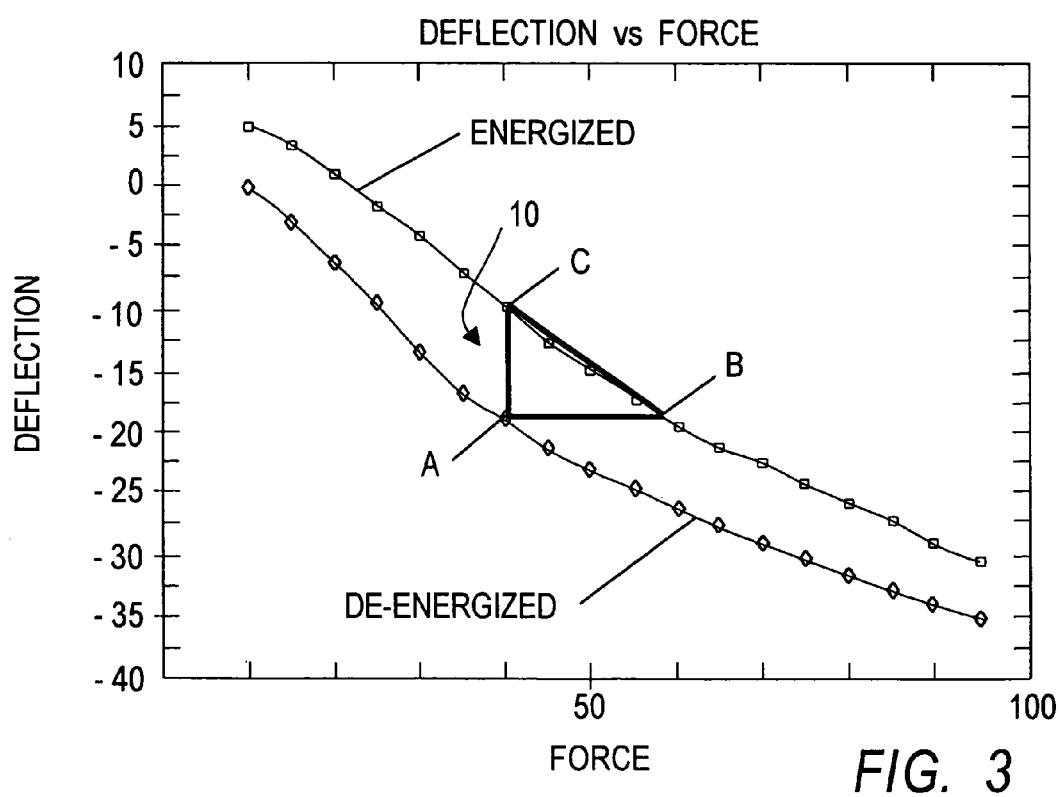
FIG. 3 is a graph illustrating performance of a smart material actuator at a predetermined pre-load.

Now referring to FIG. 3, a displacement-force graph using the same data as in FIG. 1 and FIG. 2 is depicted. After looking at FIG. 2, it can be seen that the peak work value is located at 40. A right angle triangle 10 is overlaid on the graph, three line segments are formed AB, BC, CA, where maximum displacement is line segment CA, blocking force line segment AB, and actuator working line segment BC. The displacement line segment CA is aligned with the peak in work value shown in FIG. 2. This is the point around which a smart material actuator can be optimally pre-loaded to preferably within at least 40% of the peak work value, more preferably to within at least 25% of the peak work value, and most preferably to within at least 10% of the peak work value or the approximate peak work value itself. If the smart material actuator were pre-loaded to 40 units the maximum displacement would be the line segment CA, or 13 units. If the smart material actuator is energized and the pre-load is increased to 60 units, blocking force would be achieved, and the line segment depicting the displacement to blocking force is segment AB. At this point the smart material actuator is back to its original height. Since it is impossible to build a spring with no resistance the line segment CA is impossible to achieve, so practical design rules prevail and a point on working segment BC can be used. This point can be optimized to be as close to the corner of triangle 10 at the intersections of line segments CA, BC. It should be noted that triangle 10 can be moved up or down slightly from the peak in work value, graphed in FIG. 2 in order to make subtle pre-loading optimizations by one skilled in the art. It should also be noted that because of the wide range of materials and geometries from which the actuators are made, each material and geometry combination can have a different set of graphs requiring each actuator to be evaluated within its particular application.

Figure 4:
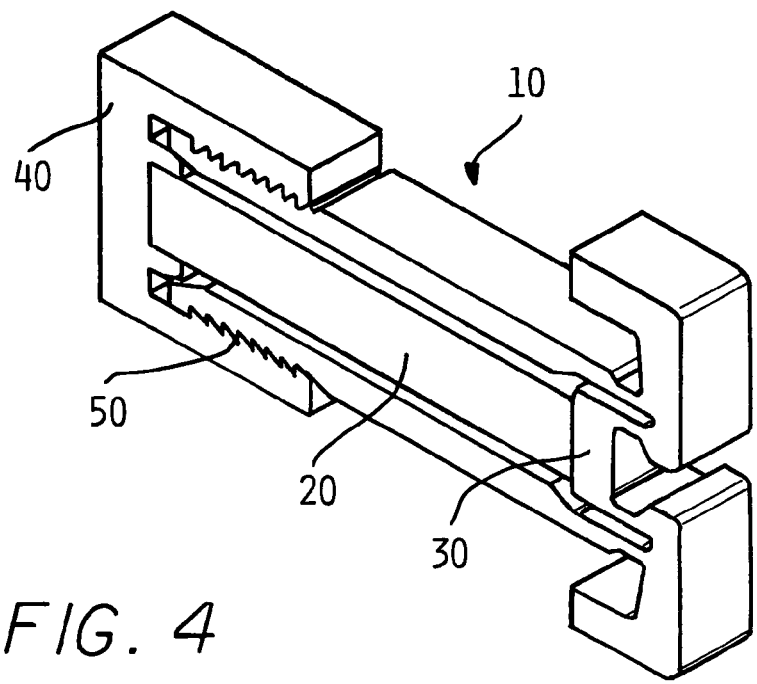
FIG. 4 is a perspective view of one embodiment of the present invention.

Now referring to FIG. 4, an actual embodiment of a pre-load mechanism is depicted. Actuator assembly 10 includes a smart material actuator 20, force transfer member 30, rigid capture ratchet cap 40, and ratchet teeth 50. In this embodiment, the compliant mechanism of the actuator assembly 10 is press fit with the ratchet cap structure 40, engaging the ratchet teeth 50, trapping the smart material actuator 20 between the force transfer member 30 and ratchet cap structure 40, causing the smart material actuator 20 to be pre-loaded by the amount of force that the ratchet cap structure 40 is forced against the force transfer member 30 and its compliant structure.

Figure 5A:
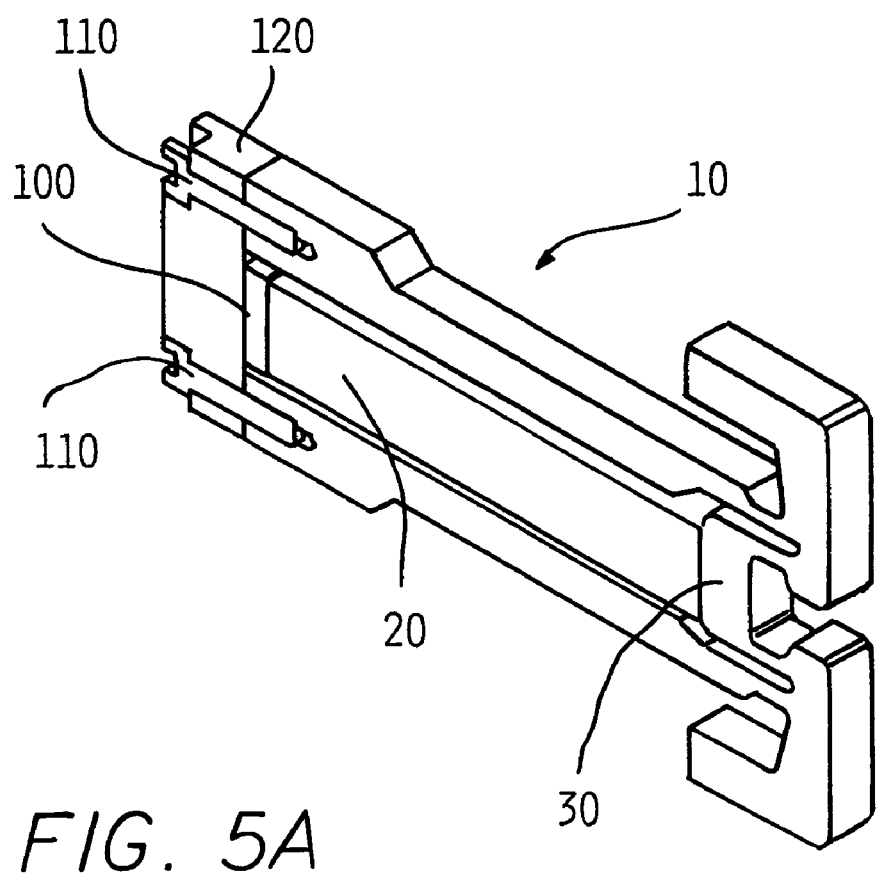
FIG. 5a is a perspective view of another embodiment of the present invention.

Now referring to FIG. 5a, a second embodiment of the present invention is depicted. Actuator assembly 10 includes a smart material actuator 20, force transfer member 30, floating plate 100, back holding plate 110, and fastener means 110. In this embodiment, the compliant mechanism of the actuator assembly 10 is held together by the back holding plate 120 with two fasteners 110 trapping the smart material actuator 20 between the force transfer member 30 and floating plate 100 causing the smart material actuator 20 to be pre-loaded by the relationship of the back holding plate 120 to the force transfer member 30 and its compliant structure.

Figure 5B:
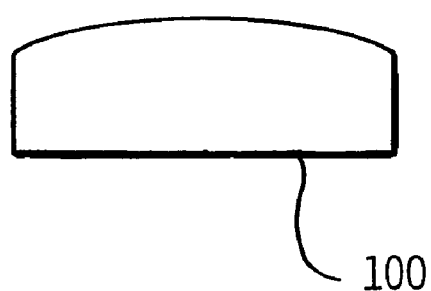
FIG. 5b is a detail view of FIG. 5a in accordance with the present invention.

Now referring to FIG. 5b, a close-up view of the floating plate 100 is depicted. As the two fasteners 110 are engaged, back plate 110 will not move in a parallel fashion to the force transfer member 30. The smart material actuator 20 does not tolerate misalignment well. Misalignment can cause a failure of the smart material actuator 20 during assembly. Floating plate 100 is designed to allow misalignment between the two surfaces. It accomplishes this by creating a point contact with back holding plate 110 and a flat surface with smart material actuator 20.

Figure 6A:
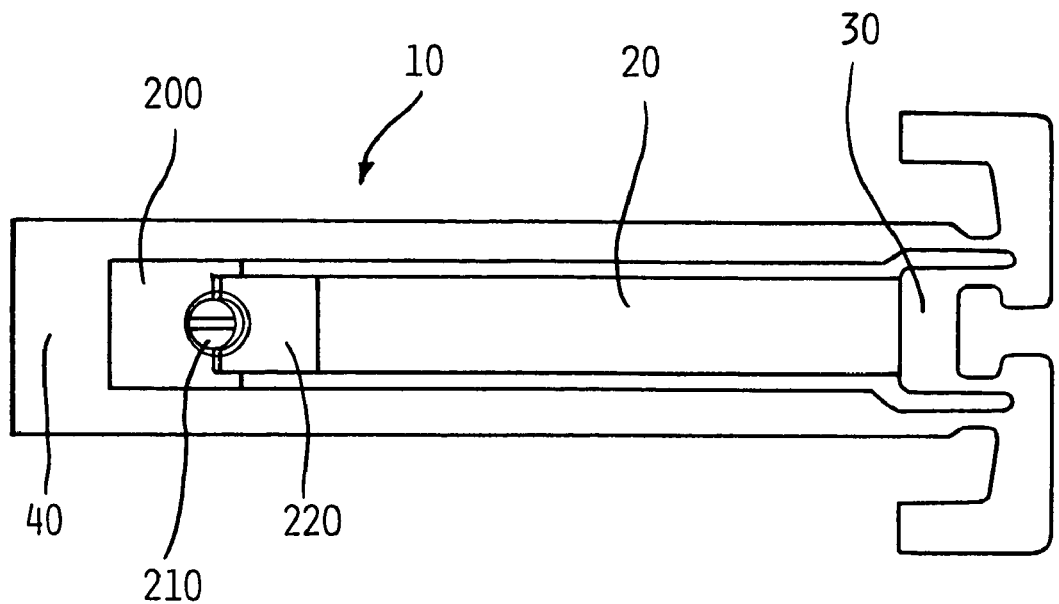
FIG. 6a is a side view of another embodiment of the present invention.

Now referring to FIG. 6a, a third embodiment of the present invention is depicted. Actuator assembly 10 includes a smart material actuator 20, force transfer member 30, rigid back plate 40, lower cam block 210, upper cam block 220, and adjustable cam 210. In this embodiment, the compliant mechanism of the actuator assembly 10 is of a single one-piece design, with two main features including the rigid rear support 40 and force transfer member 30. A second subassembly including the cam block assembly 200, 210, 220 is designed as an adjustable spacer. The smart material actuator 20 is captured between the cam block assembly 200, 210, 220 and force transfer member 30. The cam block assembly 200, 210, 220 is supported by the rigid rear support 40. As the adjustment cam 210 is moved the dimensions of the adjustable spacer change, creating greater or less pre-load.

Figure 6B:
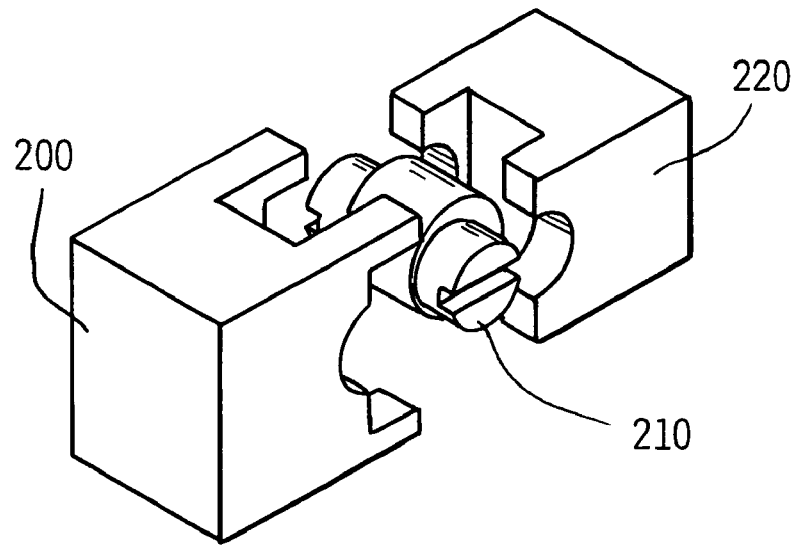
FIG. 6b is a detail view of FIG. 8a in accordance with the present invention.

Now referring to FIG. 6b, an exploded view of the cam block assembly of FIG. 6a of the present invention is depicted. The lower cam block 200 acts as a bearing for cam screw 210, and upper cam block 220 acts as the surface against which the cam screw 210 can act. As the cam screw 210 is rotated the upper cam block moves changing the overall dimension, and creating an adjustable spacer.

Figure 7A:
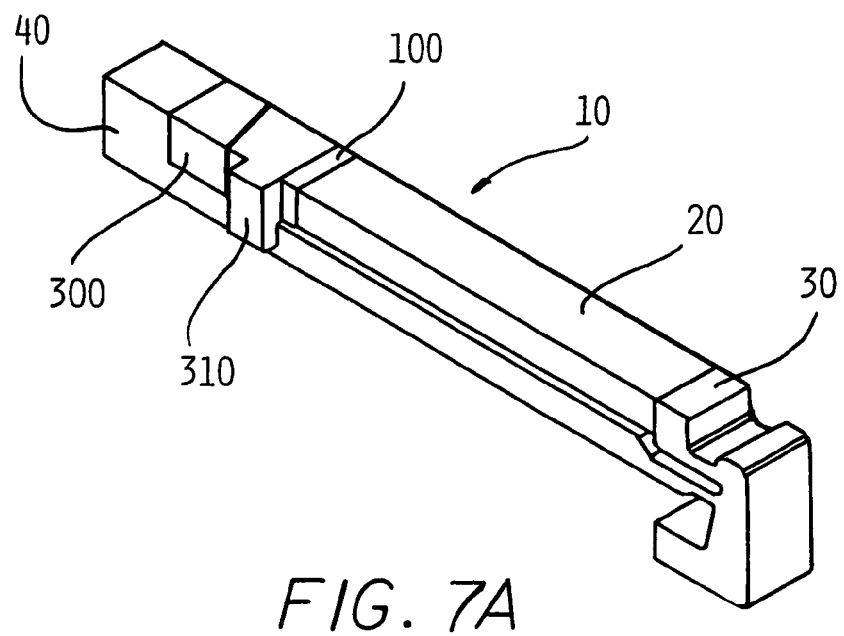
FIG. 7a is a cutaway perspective view of another embodiment of the present invention.

Now referring to FIG. 7a, a cutaway view of a fourth embodiment of the present invention is depicted. The actuator assembly 10 is shown cut at about the midpoint, such that the internal features are visible. Actuator assembly 10 includes a smart material actuator 20, force transfer member 30, rigid back support 40, lower wedge 300, upper wedge 310, and floating plate 100. In this embodiment, the compliant mechanism of the actuator assembly 10 is of a single one-piece design, with two main features including the rigid rear support 40 and force transfer member 30. A second subassembly including the wedge block assembly 300, 310 is designed as an adjustable spacer. The smart material actuator 20 is captured between the wedge block assembly 300, 310 and floating plate 100. The wedge block assembly 300, 310 is supported by the rigid rear support 40. As the wedge assembly 300, 310 is moved with respect to one another the dimensions of the adjustable spacer change, creating greater or less pre-load. The smart material actuator 20 does not tolerate misalignment well. Misalignment could cause a failure of the smart material actuator 20 during assembly. Floating plate 100 is designed to allow misalignment between the two surfaces. It accomplishes this by creating a point contact with back holding plate 110 and a flat surface with a smart material actuator 20.

Figure 7B:
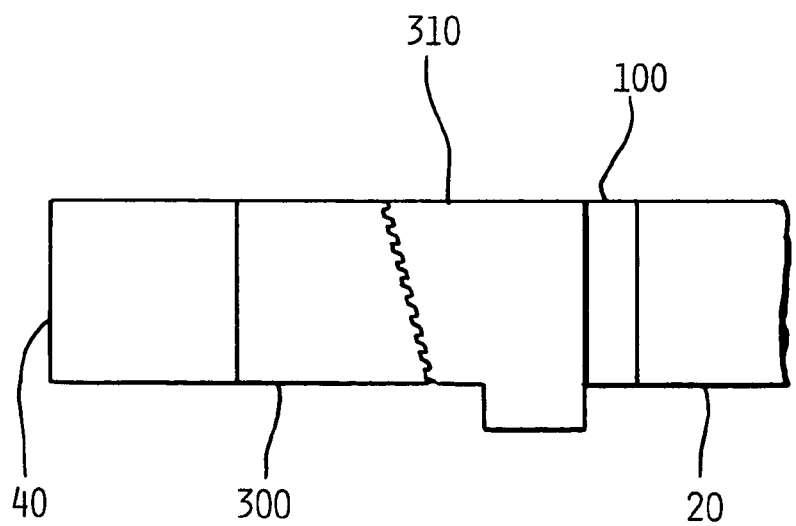
FIG. 7b is a detail view of FIG. 8a in accordance with the present invention.

Referring now to FIG. 7b, a close-up view of the wedge block assembly 300, 310 of FIG. 7a of the present invention is depicted. The lower wedge block 300 and upper wedge block 310 act as an adjustable spacer. As the upper and lower wedges 300 are driven together the spacer increases in dimension and as the upper and lower wedges are driven away from one another the spacer decreases in dimension. The wedges are held in place with a toothed arrangement. In this manner, an adjustable spacer is created.

Figure 8:
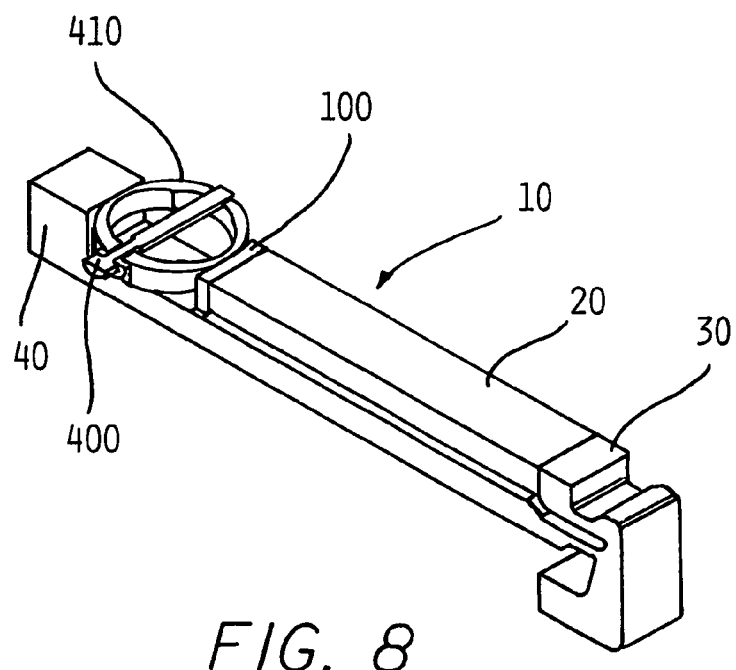
FIG. 8 is a cutaway perspective view of another embodiment of the present invention.

Referring now to FIG. 8, a cutaway view of a fifth embodiment of the present invention is presented. The actuator assembly 10 is shown cut at about the midpoint such that the internal features are visible. Actuator assembly 10 includes a smart material actuator 20, force transfer member 30, rigid back support 40, ring spacer 410, ring adjustment screw 400, and floating plate 100. In this embodiment, the compliant mechanism of the actuator assembly 10 is of a single one-piece design, with two main features including the rigid rear support 40 and force transfer member 30. A second subassembly, the adjustable ring spacer assembly 400, 410 can be designed as an adjustable spacer. The smart material actuator 20 can be captured between the adjustable ring spacer assembly 400, 410, and floating plate 100. The adjustable ring spacer assembly 400, 410 can be supported by the rigid rear support 40. As the ring adjustment screw 400 is rotated, the dimensions of the adjustable spacer change, creating greater or less pre-load. The smart material actuator 20 does not tolerate misalignment well. Misalignment could cause a failure of the smart material actuator 20 during assembly. Floating plate 100 is designed to allow misalignment between the two surfaces. It accomplishes this by creating a point contact with back holding plate 110 and a flat surface with smart material actuator 20.

Figure 9:
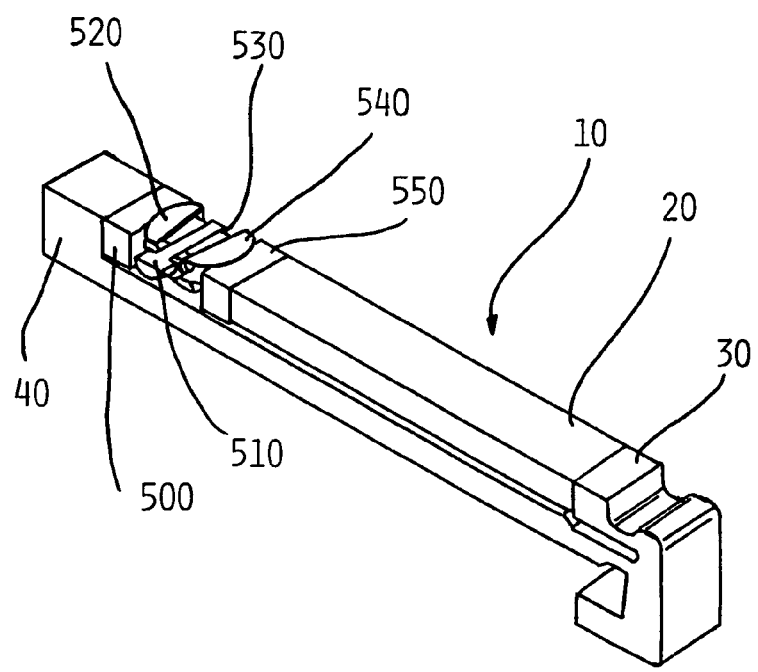
FIG. 9 is a cutaway perspective view of another embodiment of the present invention.

Referring now to FIG. 9, a cutaway view of a sixth embodiment of the present invention is depicted. The actuator assembly 10 is shown cut at about the midpoint such that the internal features are visible. Actuator assembly 10 includes of a smart material actuator 20, force transfer member 30, rigid back support 40, lower semicircle wedge 520, upper semicircle wedge 540, center wedge 530, wedge adjustment screw 510, and upper and lower bearings 500, 540. In this embodiment, the compliant mechanism of the actuator assembly 10 is of a single one-piece design, with two main features including the rigid rear support 40 and force transfer member 30. A second subassembly, the adjustable wedge assembly 500, 510, 520, 530, 540, 550 can be designed as an adjustable spacer. The smart material actuator 20 can be captured between the adjustable wedge assembly 500, 510, 520, 530, 540, 550. The adjustable wedge assembly 500, 510, 520, 530, 540, 550 can be supported by the rigid rear support 40. As the wedge adjustment screw 510 is rotated, the dimensions of the adjustable spacer change, creating greater or less pre-load. Bearing blocks 500, 540 can provide a surface for the upper and lower semicircle wedges to rotate. Upper and lower semicircle wedges 500, 540 have a second bearing surface that can interface with the center wedge 530 as the center wedge 530 is drawn toward the head of the wedge adjustment screw 510 driving the upper and lower semicircle wedges away from each other driving upper and lower bearing blocks creating more pre-load. As the center wedge 530 is drawn away from the head of the wedge adjustment screw 510, driving the upper and lower semicircle wedges towards each other, driving upper and lower bearing blocks, and creating less pre-load.

Figure 10:
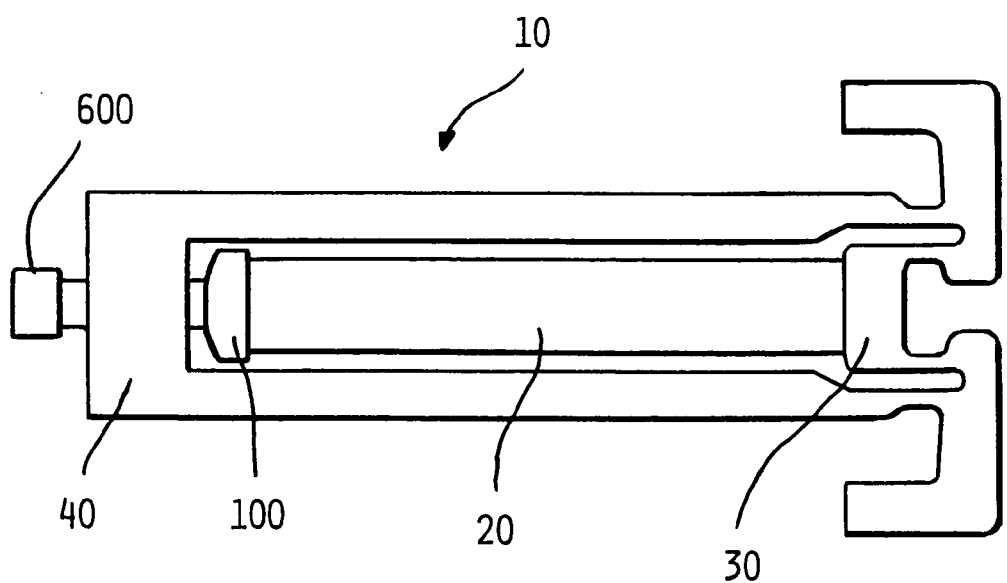
FIG. 10 is a side view of another embodiment of the present invention.

Now referring to FIG. 10, a seventh embodiment of the present invention is depicted. Actuator assembly 10 includes a smart material actuator 20, force transfer member 30, rigid back plate 40, pre-load screw 600, and floating plate 100. In this embodiment, the compliant mechanism of the actuator assembly 10 is of a single one-piece design, with two main features including the rigid rear support 40 and force transfer member 30. The pre-load screw 100 can be supported by the rigid back plate 40, and the floating plate 100 can be positioned between smart material actuator 20 and pre-load screw 600. Pre-load screw 600 can be threaded and as the screw rotates it can act as an adjustable spacer. As the pre-load screw 600 rotates, such that additional force is applied to the smart material actuator 20, the pre-load value is increasing or greater, and as the screw rotates such that force is being removed from the smart material actuator 20, the pre-load value is decreasing or less. The smart material actuator 20 does not tolerate misalignment well. Misalignment can cause a failure of the smart material actuator 20 during assembly. Floating plate 100 is designed to allow misalignment between the two surfaces. It accomplishes this by creating a point contact with the pre-load screw 600 and a flat surface with smart material actuator 20.

While the invention has been described in conjunction with what are presently considered to be the most practical and preferred embodiments, it is to be understood that the invention is not to be limited to the disclosed embodiments but, on the contrary, it is intended to cover various modifications and equivalent arrangement included within the spirit and scope of the appended claims, which scope is to be accorded the broadest interpretation so as to encompass all such modifications and equivalent structures as permitted under law.

What is claimed is:

1. An apparatus comprising:
a support structure defining a rigid non-flexing portion and a movable portion;
a smart material actuator for driving the movable portion of the support structure between first and second positions; and
means for preloading the smart material actuator with a sufficient preload force to optimize work output of the support structure, where work output is defined as a function of displacement and force with infinite life of the support structure, wherein the preloading means is located between the rigid, non-flexing portion of the support structure and the smart material actuator, the preloading means including an adjustable wedge positioned between the rigid, non-flexing portion of the support structure and one end of the smart material actuator, wherein the adjustable wedge includes a first semi-circular wedge portion, a second complementary semi-circular wedge portion, a center wedge portion, and an adjustment screw, such that adjustment of the screw moves the center wedge portion with respect to the first and second semi-circular wedge portions toward and away from one another and adjusts an amount of preload applied to the smart material actuator.

2. An apparatus comprising:
a support structure defining a rigid non-flexing portion and a movable portion;
a smart material actuator for driving the movable portion of the support structure between first and second positions; and
means for preloading the smart material actuator with a sufficient preload force to optimize work output of the support structure, where work output is defined as a function of displacement and force with infinite life of the support structure, wherein the preloading means is located between the rigid, non-flexing portion of the support structure and the smart material actuator, the preloading means including an adjustable wedge positioned between the rigid, non-flexing portion of the support structure and one end of the smart material actuator, wherein the adjustable wedge includes a first longitudinal wedge portion engageable with the rigid, non-flexing portion of the support structure, and a second longitudinal wedge portion engageable with one end of the smart material actuator, the first wedge portion having a transversely extending, angled, serrated surface and the second wedge portion having a complementary transversely extending, angled, serrated surface for operable interlocking engagement with the first wedge portion, such that transverse movement of one wedge portion with respect to the other wedge portion adjusts an amount of preload applied to the smart material actuator.

3. An apparatus comprising:
a support structure defining a rigid non-flexing portion and a movable portion;
a smart material actuator for driving the movable portion of the support structure between first and second positions; and
means for preloading the smart material actuator with a sufficient preload force to optimize work output of the support structure, where work output is defined as a function of displacement and force with infinite life of the support structure, wherein the preloading means is located between the rigid, non-flexing portion of the support structure and the smart material actuator, the preloading means including an adjustable wedge positioned between the rigid, non-flexing portion of the support structure and one end of the smart material actuator, wherein the adjustable wedge includes a first cam surface portion, a second complementary cam surface portion, a cam screw located between the first and second cam surface portions, such that adjustment of the cam screw moves the cam surface portions with respect to the one another and adjusts an amount of preload applied to the smart material actuator.

4. An apparatus comprising:
a support structure defining a rigid non-flexing portion and a movable portion;
a smart material actuator for driving the movable portion of the support structure between first and second positions; and
means for preloading the smart material actuator with a sufficient preload force to optimize work output of the support structure, where work output is defined as a function of displacement and force with infinite life of the support structure, wherein the preloading means is located between the rigid, non-flexing portion of the support structure and the moveable portion of the support structure, wherein the preloading means includes the rigid, non-flexing portion of the support structure having a separable, adjustable, rigid, non-flexing web operably engageable with at least one rigid, non-flexing arm of the support structure, such that the adjustment of the web with respect to the at least one arm allows locking engagement between the web and the at least one arm of the support structure at a predetermined preload on the smart material actuator.

5. The apparatus of claim 4, wherein the preloading means further comprises:
the web having a first serrated portion engageable with a complementary second serrated portion formed on the at least one arm for operable interlocking engagement with one another, such that movement of web with respect to the at least one arm adjusts an amount of preload applied to the smart material actuator.

6. The apparatus of claim 4, wherein the preloading means further comprises:
the web having at least one adjustable screw operably engageable within at least one corresponding threaded aperture formed in the at least one arm for operable interlocking engagement with one another, such that adjustment of the screw causes movement of web with respect to the at least one arm and applies preload to the smart material actuator.

7. The apparatus of claim 1, wherein the preloading means optimizes work output to an efficiency of between approximately 60% to approximately 90%, inclusive of the work input from the smart material actuator.

8. The apparatus of claim 1, wherein the preloading means optimizes work output to an efficiency of greater than 60%, inclusive of the work input from the smart material actuator.

9. The apparatus of claim 1, wherein the preloading means optimizes work output to an efficiency of between approximately 75% to approximately 90%, inclusive of the work input from the smart material actuator.

10. The apparatus of claim 1, wherein the preloading means optimizes work output to an efficiency of greater than 75%, inclusive of the work input from the smart material actuator.

11. The apparatus of claim 1, wherein the preloading means optimizes work output to an efficiency of greater than 90%, inclusive of the work input from the smart material actuator.

12. The apparatus of claim 1, wherein the preloading means optimizes work output to within 20% of peak load as determined by the force displacement product versus force curve of the work input from the smart material actuator.

13. The apparatus of claim 2, wherein the preloading means optimizes work output to an efficiency of between approximately 60% to approximately 90%, inclusive of the work input from the smart material actuator.

14. The apparatus of claim 2, wherein the preloading means optimizes work output to an efficiency of greater than 60%, inclusive of the work input from the smart material actuator.

15. The apparatus of claim 2, wherein the preloading means optimizes work output to an efficiency of between approximately 75% to approximately 90%, inclusive of the work input from the smart material actuator.

16. The apparatus of claim 2, wherein the preloading means optimizes work output to an efficiency of greater than 75%, inclusive of the work input from the smart material actuator.

17. The apparatus of claim 2, wherein the preloading means optimizes work output to an efficiency of greater than 90%, inclusive of the work input from the smart material actuator.

18. The apparatus of claim 2, wherein the preloading means optimizes work output to within 20% of peak load as determined by the force displacement product versus force curve of the work input from the smart material actuator.

19. The apparatus of claim 3, wherein the preloading means optimizes work output to an efficiency of between approximately 60% to approximately 90%, inclusive of the work input from the smart material actuator.

20. The apparatus of claim 3, wherein the preloading means optimizes work output to an efficiency of greater than 60%, inclusive of the work input from the smart material actuator.

21. The apparatus of claim 3, wherein the preloading means optimizes work output to an efficiency of between approximately 75% to approximately 90%, inclusive of the work input from the smart material actuator.

22. The apparatus of claim 3, wherein the preloading means optimizes work output to an efficiency of greater than 75%, inclusive of the work input from the smart material actuator.

23. The apparatus of claim 3, wherein, the preloading means optimizes work output to an efficiency of greater than 90%, inclusive of the work input from the smart material actuator.

24. The apparatus of claim 3, wherein the preloading means optimizes work output to within 20% of peak load as determined by the force displacement product versus force curve of the work input from the smart material actuator.

25. The apparatus of claim 4, wherein the preloading means optimizes work output to an efficiency of between approximately 60% to approximately 90%, inclusive of the work input from the smart material actuator.

26. The apparatus of claim 4, wherein the preloading means optimizes work output to an efficiency of greater than 60%, inclusive of the work input from the smart material actuator.

27. The apparatus of claim 4, wherein the preloading means optimizes work output to an efficiency of between approximately 75% to approximately 90%, inclusive of the work input from the smart material actuator.

28. The apparatus of claim 4, wherein the preloading means optimizes work output to an efficiency of greater than 75%, inclusive of the work input from the smart material actuator.

29. The apparatus of claim 4, wherein the preloading means optimizes work output to an efficiency of greater than 90%, inclusive of the work input from the smart material actuator.

30. The apparatus of claim 4, wherein the preloading means optimizes work output to within 20% of peak load as determined by the force displacement product versus force curve of the work input from the smart material actuator.

* * * * *

UNITED STATES PATENT AND TRADEMARK OFFICE
CERTIFICATE OF CORRECTION

| | |
|---|---|
| PATENT NO. | : 7,368,856 B2 |
| APPLICATION NO. | : 10/818004 |
| DATED | : May 6, 2008 |
| INVENTOR(S) | : Jeff Moler |

It is certified that error appears in the above-identified patent and that said Letters Patent is hereby corrected as shown below:

On the Title Page Item -56- (Other Publication), Line 3; After "motion" delete ")".

Column 7, Line 67; In Claim 2, after "structure" delete ",".

Column 10, Line 17; In Claim 23, after "wherein" delete ",".

Signed and Sealed this

Twenty-ninth Day of July, 2008

JON W. DUDAS
*Director of the United States Patent and Trademark Office*